United States Patent
Lee et al.

(10) Patent No.: US 6,830,981 B2
(45) Date of Patent: Dec. 14, 2004

(54) VERTICAL NANOTUBE TRANSISTOR AND PROCESS FOR FABRICATING THE SAME

(75) Inventors: Chun-Tao Lee, Hsinchu (TW); Lin-Hung Shi, Ilan (TW); Chi-Cherng Jeng, Hsinchu (TW); Wen-Ti Lin, Hsinchu (TW); Wei-Su Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 90 days.

(21) Appl. No.: 10/301,715

(22) Filed: Nov. 22, 2002

(65) Prior Publication Data

US 2004/0004235 A1 Jan. 8, 2004

(30) Foreign Application Priority Data

Jul. 2, 2002 (TW) .................................... 91114596 A

(51) Int. Cl.[7] ...................... H01L 21/331; H01L 21/82; H01L 29/76
(52) U.S. Cl. ...................... 438/309; 438/132; 257/213
(58) Field of Search ................................ 438/132, 309; 257/213, 565

(56) References Cited

U.S. PATENT DOCUMENTS 6,515,325 B1 * 2/2003 Farnworth et al. .......... 257/296

* cited by examiner

Primary Examiner—David Zarneke
Assistant Examiner—Scott B. Geyer
(74) Attorney, Agent, or Firm—Birch, Stewart, Kolasch & Birch, LLP

(57) ABSTRACT

A vertical nanotube transistor and a process for fabricating the same. First, a source layer and a catalyst layer are successively formed on a substrate. A dielectric layer is formed on the catalyst layer and the substrate. Next, the dielectric layer is selectively removed to form a first dielectric mesa, a gate dielectric layer spaced apart from the first dielectric mesa by a first opening, and a second dielectric mesa spaced apart from the gate dielectric layer by a second opening. Next, a nanotube layer is formed in the first opening. Finally, a drain layer is formed on the nanotube layer and the first dielectric mesa, and a gate layer is formed in the second opening. The formation position of the nanotubes can be precisely controlled.

14 Claims, 6 Drawing Sheets

US 6,830,981 B2

VERTICAL NANOTUBE TRANSISTOR AND PROCESS FOR FABRICATING THE SAME

This nonprovisional application claims priority under 35 U.S.C. § 119(a) on Patent Application No. 091114596 filed in TAIWAN, R.O.C. on Jul. 2, 2002, which is herein incorporated by reference.

BACKGROUND OF THE INVENTION

1. Field of the Invention

The present invention relates to a vertical nanotube transistor and a process for fabricating the same.

2. Description of the Prior Art

Due to the improvement of techniques for the production of integrated circuits in recent years, the number of semiconductor devices contained on a chip has increased, and the minimum dimensions of a device have become finer for higher integration. Nanometer-scale technology, such as nanotube transistors, has become a focus in industry. Carbon has proven to be the most suitable material for nanoscale devices.

Conventionally, there are two processes for fabricating carbon nanotube transistors (CNT). The first process uses an atomic force microscope (AFM) to force carbon nanotubes onto a substrate on which a gate, source, and drain have been already formed. A carbon nanotube transistor 100 as shown in FIG. 1 is obtained. 110 indicates a source, 120 a drain, 130 a gate, and 140 carbon nanotubes. The carbon nanotube transistor 100 obtained has good transistor properties. However, the formation position of carbon nanotubes cannot be precisely controlled, thus the process is not practical.

The second process includes the following steps. First, an aluminum substrate is subjected to anodic treatment to form nanoscale pores. Next, a catalyst (such as Ni, Fe, or Co) is electroplated on the pore bottom. Next, carbon nanotubes are formed in the pores by chemical vapor deposition (CVD). Next, two ends of the carbon nanotubes formed are connected to different electrodes (serving as source and drain). Finally, an insulating layer is covered and a metal layer is formed to serve as a gate. A carbon nanotube transistor 200 as shown in FIG. 2 is thus formed. In FIG. 2, 210 indicates a source, 220 a drain, 230 a gate, 240 carbon nanotubes, and 250 an insulating layer. However, in the carbon nanotube transistor 200 formed by the above-mentioned process, the gate is not on a plane parallel to a plane on which the source and drain are disposed. The structure is different from ordinary transistors. Therefore, the driving ability of the gate is decreased. In addition, the pores in which nanotubes are formed are defined by anodic treatment of the aluminum substrate. Therefore, the formation position of nanotubes cannot be precisely controlled.

SUMMARY OF THE INVENTION

The object of the present invention is to solve the above-mentioned problem and provide a vertical nanotube transistor and a process for fabricating the same, in which the formation position of nanotubes can be precisely controlled.

To achieve the above object, the process for fabricating a vertical nanotube transistor according to the present invention includes the following steps. First, a source layer and a catalyst layer are successively formed on a substrate. A dielectric layer is formed on the catalyst layer and the substrate. Next, the dielectric layer is selectively removed to form a first dielectric mesa on the catalyst layer, a gate dielectric layer on the substrate to align with a sidewall of the catalyst layer and the first metal layer, and a second dielectric mesa on the substrate. The first dielectric mesa and the gate dielectric layer are spaced apart by a first opening, and the gate dielectric layer and the second dielectric mesa are spaced apart by a second opening. Next, a nanotube layer is formed in the first opening. Finally, a drain layer is formed on the nanotube layer and the first dielectric mesa and a gate layer is formed in the second opening.

The vertical nanotube transistor of the present invention includes a source layer formed on a substrate; a catalyst layer formed on the source layer; a first dielectric mesa on the catalyst layer; a gate dielectric layer on the substrate to align with a sidewall of the catalyst layer and the source layer and spaced apart from the first dielectric mesa by a first opening; a second dielectric mesa on the substrate and spaced apart from the gate dielectric layer by a second opening; a nanotube layer formed in the first opening; a drain layer on the nanotube layer and the first dielectric mesa; and a gate layer in the second opening.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

FIGS. 3a to 3j are cross-sections illustrating the process flow of fabricating a vertical carbon nanotube transistor according to a preferred embodiment of the present invention.

Figure 1:
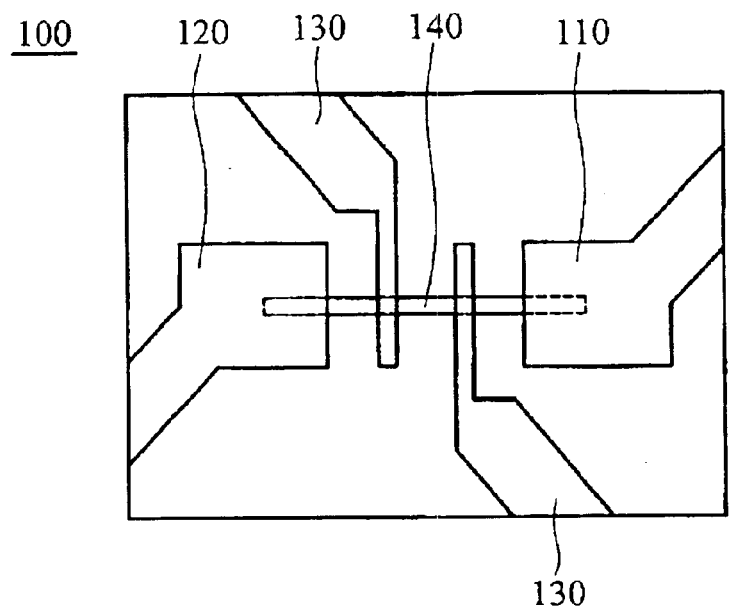
FIG. 1 is a top view showing a conventional carbon nanotube transistor.
Figure 2:
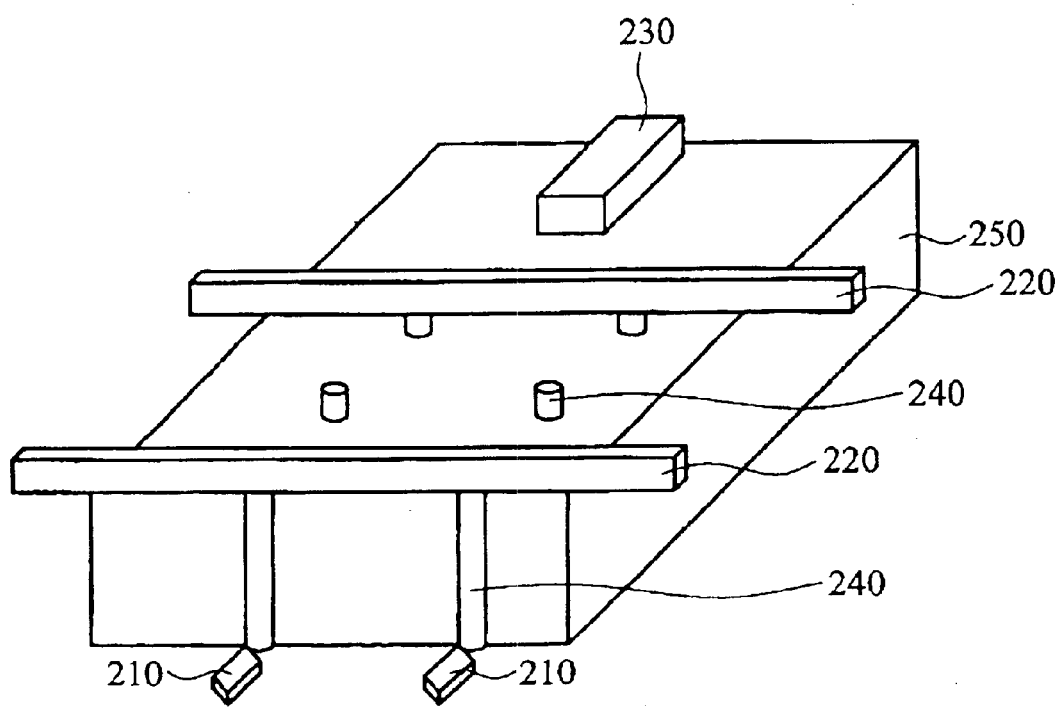
FIG. 2 is a perspective view showing a conventional carbon nanotube transistor.
Figure 3A:
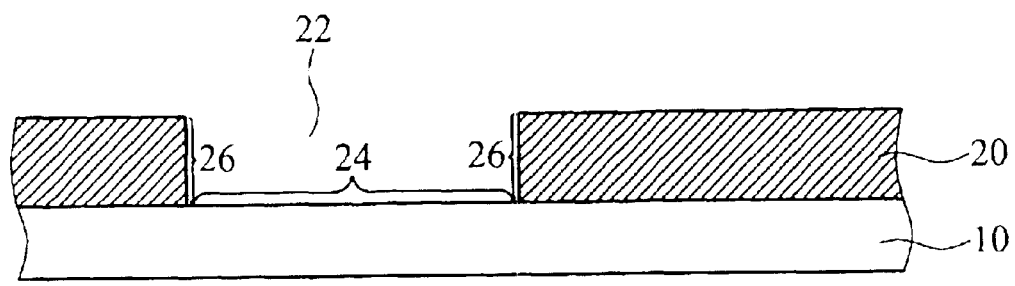
FIGS. 3a to 3j are cross-sections illustrating the process flow of fabricating a vertical carbon nanotube transistor according to a preferred embodiment of the present invention.

First, referring to FIG. 3a, a first photoresist layer 20 is formed on a substrate 10 and patterned. The first photoresist layer 20 has a hole area 22 to expose the substrate 10. The hole area 22 has a bottom 24 and two sidewalls 26.

Figure 3B:
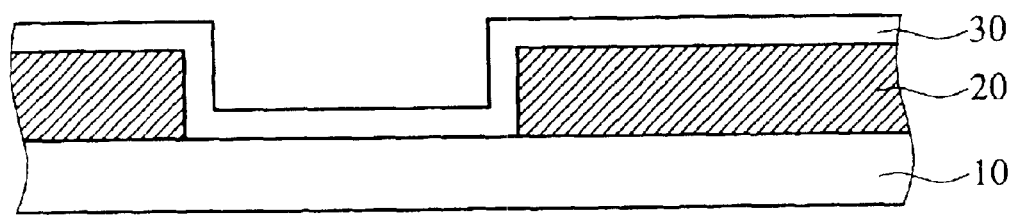

Subsequently, referring to FIG. 3b, a first metal layer 30 is formed on the first photoresist layer 20 and in the hole area 22 (that is, on the bottom 24 and sidewalls 26). The first metal layer 30 can be aluminum.

Figure 3C:
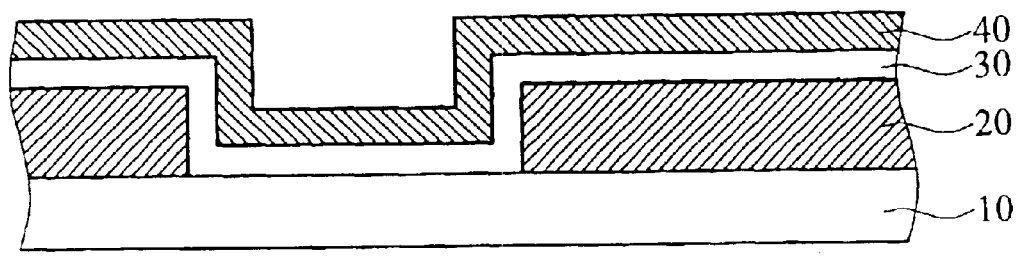

Subsequently, referring to FIG. 3c, a catalyst layer 40 is formed on the first metal layer 30. The catalyst layer 40 can be formed by either of the following two methods. The first method first dissolves ferric nitrate crystals in ethanol, and then adds ethyl silicate to form a catalyst solution. The catalyst solution is then spin coated on the first metal layer 30 and dried. The second method implants iron, cobalt, or nickel ions onto the first metal layer 30.

Figure 3D:
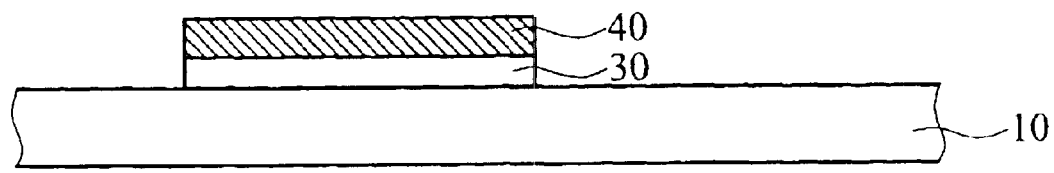

Subsequently, referring to FIG. 3d, the catalyst layer 40, the first metal layer 30, and the first photoresist layer 20 are selectively removed to expose the substrate 10, leaving the catalyst layer 40 and the first metal layer 30 on the bottom 24. The remaining first metal layer 30 serves as a source.

Figure 3E:
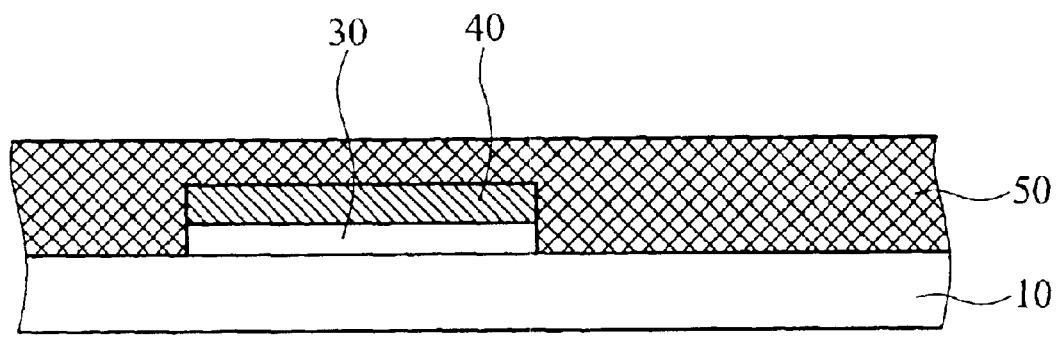
Figure 3F:
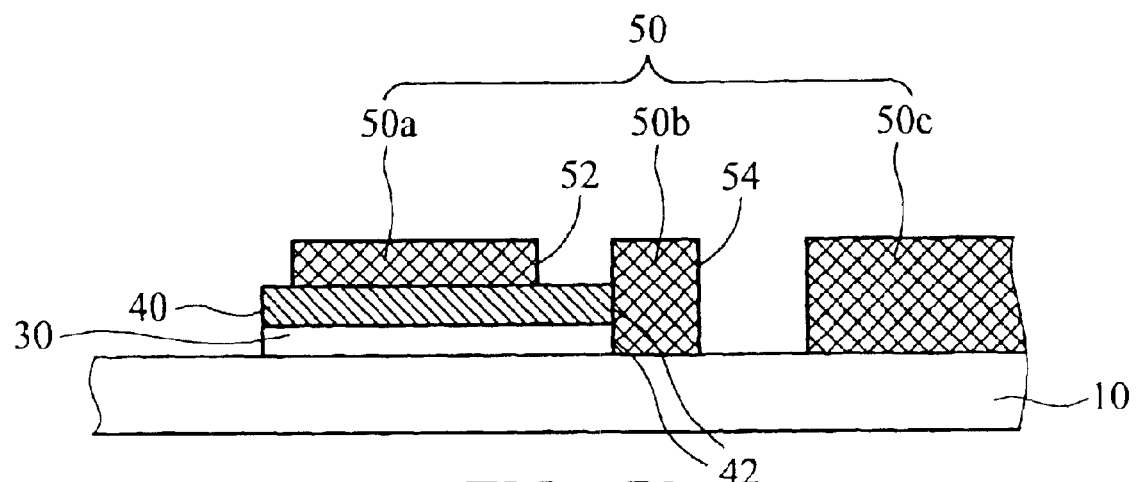

Subsequently, referring to FIG. 3e, a dielectric layer 50 is formed on the entire surface of the catalyst layer 40 and the substrate 10. Next, referring to FIG. 3f, the dielectric layer 50 is patterned by photolithography and etching to form three portions, a first dielectric mesa 50a, a gate dielectric layer 50b, and a second dielectric mesa 50c. The first dielectric mesa 50a is disposed on the catalyst layer 40. The gate dielectric layer 50b is disposed on the substrate 10 to align with a sidewall 42 of the catalyst layer 40 and the first metal layer 30, such that the first dielectric mesa 50a and the gate dielectric layer 50b are spaced apart by a first opening 52. The second dielectric mesa 50c is disposed on the substrate 10, such that the gate dielectric layer 50b and the second dielectric mesa 50c are spaced apart by a second opening 54.

Figure 3G:
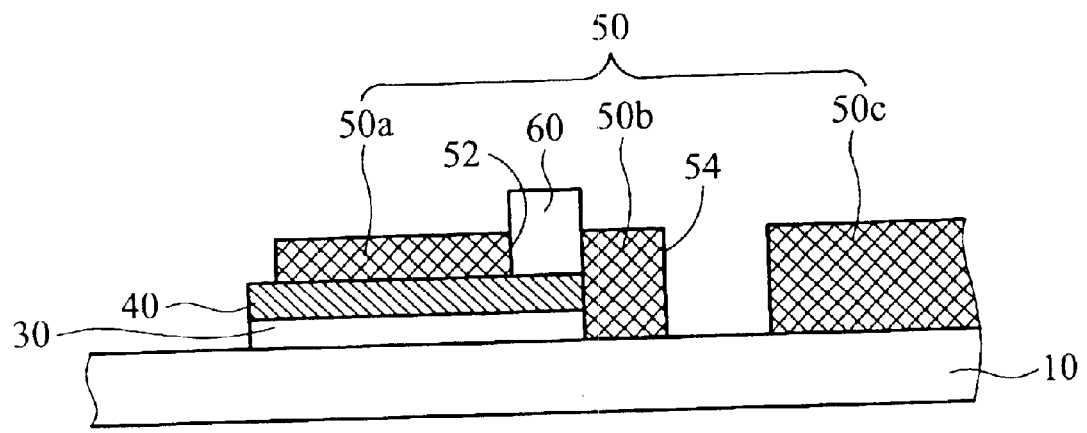

Subsequently, referring to FIG. 3g, a carbon nanotube layer (CNT layer) 60 is formed in the first opening 52. If the first opening 52 is less than 20 nm, the catalyst layer 40 can be formed over the entire surface. Thus, a single carbon nanotube is formed in each first opening 52, having a diameter the same as the width thereof. If the first opening 52 is larger than 180 nm, the catalyst layer 40 must be catalyst nanoparticles formed by sputtering, coating, or ion implantation. Thus, a plurality of carbon nanotubes are formed in each first opening 52, having a diameter the same as the particle size of the catalyst nanoparticles.

Figure 3H:
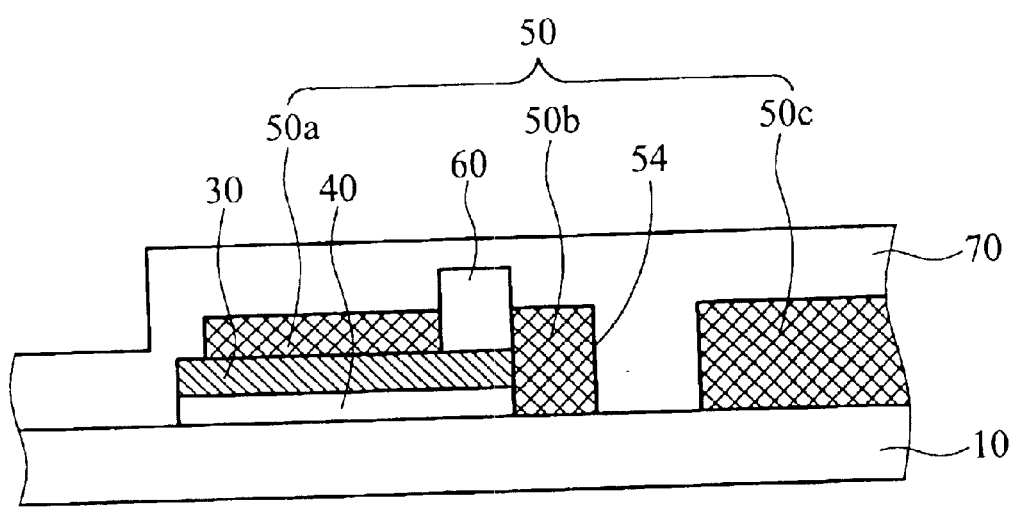
Figure 3I:
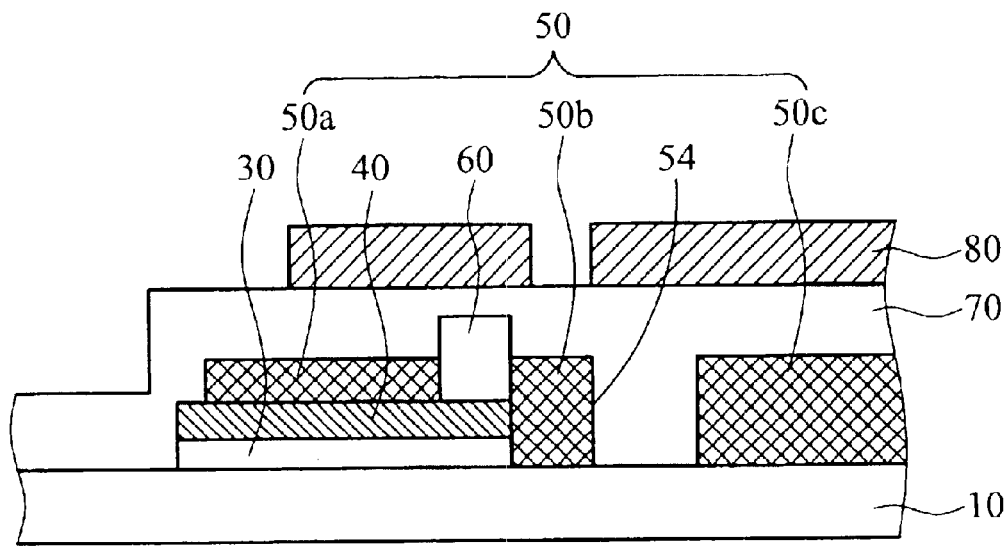
Figure 3J:
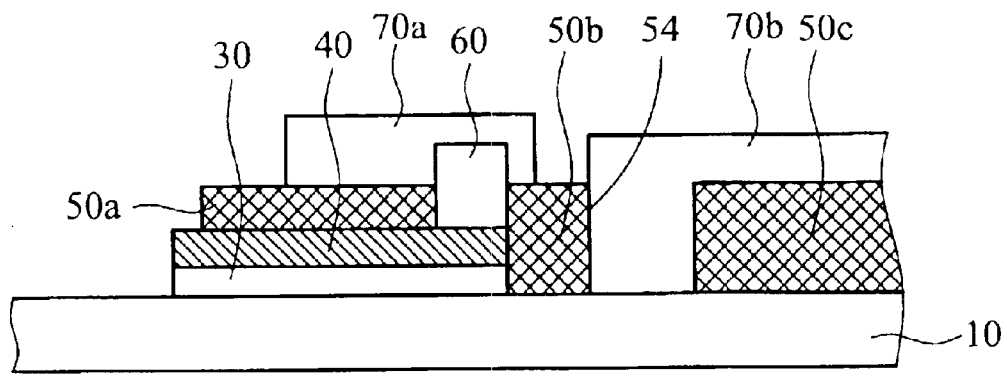

Finally, referring to FIG. 3h, a second metal layer 70 is formed on the CNT layer 60, the dielectric layer 50, and in the second opening 54. The second metal layer 70 can be aluminum. Referring to FIG. 3i, a second photoresist layer 80 is formed on the second metal layer 70 and patterned. Referring to FIG. 3j, the second metal layer 70 is patterned using the second photoresist layer 80 to form two portions, a drain layer 70a and a gate layer 70b. The drain layer 70a is disposed on the nanotube layer 60 and the first dielectric mesa 50a. The gate layer 70b is disposed in the second opening 54.

In conclusion, by means of photolithography and etching, the present invention fabricates a vertical nanotube transistor having nanotubes in a precisely controlled position.

Figure 4:
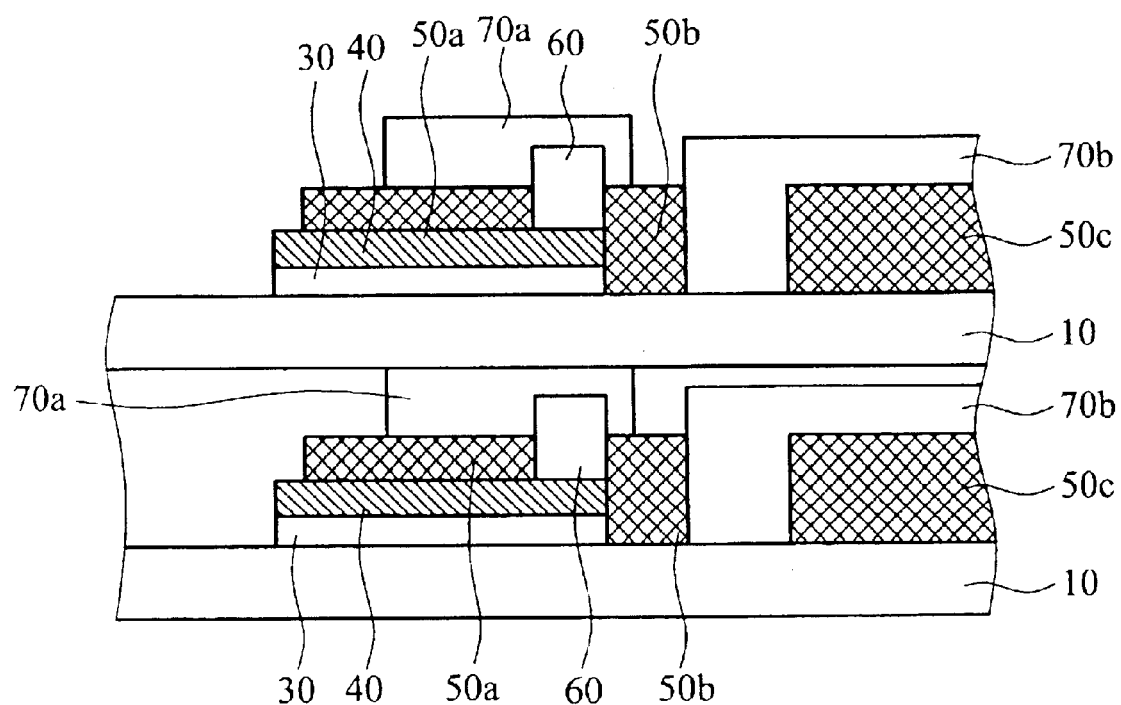
FIG. 4 is a cross-section of a nanoscale device constituting two layers of vertical carbon nanotube transistors according to a preferred embodiment of the present invention.

FIG. 4 is a cross-section of a nanoscale device constituting two layers of vertical carbon nanotube transistors according to a preferred embodiment of the present invention. The same numerals as in FIG. 3j represent the same elements. Low temperature, for example, lower than 400° C., is required for fabricating carbon nanotube devices. Therefore, it is easy to fabricate a device with multiple layers of vertical nanotube transistors as shown in FIG. 4 (FIG. 4 shows two layers), thus enhancing integration of circuits.

In addition, if the carbon nanotubes formed are not semiconducting, electric current can be applied to two ends of carbon nanotubes to electrically break down the carbon nanotubes. Thus, the carbon nanotubes are purified to semiconducting.

The foregoing description of the preferred embodiments of this invention has been presented for purposes of illustration and description. Obvious modifications or variations are possible in light of the above teaching. The embodiments chosen and described provide an excellent illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A process for fabricating a vertical nanotube transistor, comprising the following steps:

successively forming a source layer and a catalyst layer on a substrate;

forming a dielectric layer on the catalyst layer and the substrate;

selectively removing the dielectric layer to form a first dielectric mesa on the catalyst layer, a gate dielectric layer on the substrate to align with a sidewall of the catalyst layer and the first metal layer, and a second dielectric mesa on the substrate, wherein the first dielectric mesa and the gate dielectric layer are spaced apart by a first opening, and the gate dielectric layer and the second dielectric mesa are spaced apart by a second opening;

forming a nanotube layer in the first opening; and forming a drain layer on the nanotube layer and the first dielectric mesa and forming a gate layer in the second opening.

2. The process as claimed in claim 1, wherein the source layer is aluminum.

3. The process as claimed in claim 1, wherein the catalyst layer is formed by the following steps:

dissolving ferric nitrate crystals in ethanol, and then adding ethyl silicate to form a catalyst solution; and spin coating the catalyst solution on the first metal layer.

4. The process as claimed in claim 1, wherein the catalyst layer is formed by ion implantation with iron, cobalt, or nickel ions onto the first metal layer.

5. The process as claimed in claim 1, wherein the nanotube layer is formed by chemical vapor deposition (CVD).

6. The process as claimed in claim 1, wherein the nanotube layer is a carbon nanotube layer.

7. The process as claimed in claim 1, wherein the drain layer is aluminum.

8. The process as claimed in claim 1, wherein the step of successively forming a source layer arid a catalyst layer further includes:

forming a first photoresist layer on the substrate, the first photoresist layer having a hole region with a bottom and two sidewalls to expose the substrate;

forming a first metal layer on the first photoresist layer and in the hole region;

forming a catalyst layer on the first metal layer; and selectively removing the catalyst layer, the first metal layer, and the first photoresist layer to expose the substrate and to leave the catalyst layer and the first metal layer on the bottom of the hole region, the remaining first metal layer serving as a source.

9. A vertical nanotube transistor, comprising:

a source layer formed on a substrate;

a catalyst layer formed on the source layer;

a first dielectric mesa on the catalyst layer;

a gate dielectric layer on the substrate to align with a sidewall of the catalyst layer and the source layer, wherein the first dielectric mesa and the gate dielectric layer are spaced apart by a first opening;

a second dielectric mesa on the substrate, wherein the gate dielectric layer and the second dielectric mesa are spaced apart by a second opening;

a nanotube layer formed in the first opening;

a drain layer on the nanotube layer and the first dielectric mesa; and a gate layer in the second opening.

10. The vertical nanotube transistor as claimed in claim 9, wherein the source layer is aluminum.

11. The vertical nanotube transistor as claimed in claim 9, wherein the catalyst layer is formed by the following steps:

dissolving ferric nitrate crystals in ethanol, and then adding ethyl silicate to form a catalyst solution; and spin coating the catalyst solution on the first metal layer.

12. The vertical nanotube transistor as claimed in claim 9, wherein the catalyst layer contains iron, cobalt, or nickel ions.

13. The vertical nanotube transistor a claimed in claim 9, wherein the nanotube layer is a carbon nanotube layer.

14. The vertical nanotube transistor as claimed in claim 9, wherein the drain layer is aluminum.

* * * * *